(12) United States Patent
Menon

(10) Patent No.: US 8,436,450 B2
(45) Date of Patent: May 7, 2013

(54) DIFFERENTIAL INTERNALLY MATCHED WIRE-BOND INTERFACE

(75) Inventor: Gaurav Menon, Gilbert, AZ (US)

(73) Assignee: ViaSat, Inc., Carlsbad, CA (US)

( * ) Notice: Subject to any disclaimer, the term of this patent is extended or adjusted under 35 U.S.C. 154(b) by 1227 days.

(21) Appl. No.: 12/024,789

(22) Filed: Feb. 1, 2008

(65) Prior Publication Data

US 2009/0195325 A1 Aug. 6, 2009

(51) Int. Cl.
*H01L 23/49* (2006.01)

(52) U.S. Cl.
USPC .......................................... 257/664; 257/728

(58) Field of Classification Search .................. 257/664, 257/728
See application file for complete search history.

(56) References Cited

U.S. PATENT DOCUMENTS

| | | | | |
|---|---|---|---|---|
| 3,739,462 A * | 6/1973 | Hasty | ............................. | 438/107 |
| 4,603,297 A * | 7/1986 | Safinya | ......................... | 324/338 |
| 5,972,156 A * | 10/1999 | Brady et al. | .................. | 156/280 |
| 6,172,412 B1 * | 1/2001 | Wein et al. | ..................... | 257/664 |
| 6,377,142 B1 * | 4/2002 | Chiu et al. | ..................... | 333/238 |
| 6,420,778 B1 * | 7/2002 | Sinyansky | ..................... | 257/664 |
| 6,538,336 B1 * | 3/2003 | Secker et al. | ................. | 257/786 |
| 6,563,208 B2 * | 5/2003 | Lamson et al. | ................ | 257/691 |
| 6,646,343 B1 * | 11/2003 | Sharma et al. | ................ | 257/728 |
| 6,803,252 B2 * | 10/2004 | Lao et al. | ...................... | 438/106 |
| 6,812,580 B1 * | 11/2004 | Wenzel et al. | ................. | 257/784 |
| 7,030,490 B2 * | 4/2006 | Lee | ................................ | 257/728 |
| 7,132,740 B2 * | 11/2006 | Lamson et al. | ................ | 257/691 |
| 7,247,937 B2 * | 7/2007 | Jiang et al. | ..................... | 257/691 |
| 7,262,673 B2 * | 8/2007 | Hesselbom | ................... | 333/116 |
| 7,408,119 B2 * | 8/2008 | Qin et al. | ....................... | 174/261 |
| 7,586,193 B2 * | 9/2009 | Weste | ............................ | 257/728 |
| 7,659,618 B2 * | 2/2010 | Dangelmaier et al. | ......... | 257/728 |
| 7,667,321 B2 * | 2/2010 | Rebelo et al. | .................. | 257/728 |
| 7,675,168 B2 * | 3/2010 | Appel et al. | ................... | 257/728 |
| 2001/0015490 A1 | 8/2001 | Lee | | |
| 2002/0017963 A1 * | 2/2002 | Shimamoto et al. | .............. | 333/1 |
| 2005/0083153 A1 | 4/2005 | Qin | | |
| 2005/0116013 A1 | 6/2005 | Kwark | | |

OTHER PUBLICATIONS

International Preliminary Report on Patentability and Written Opinion dated Feb. 21, 2013 in PCT/US2009/032531.
International Search Report and Written Opinion dated Jan. 24, 2013 in PCT/US2009/032531.

* cited by examiner

*Primary Examiner* — Eugene Lee
(74) *Attorney, Agent, or Firm* — Snell & Wilmer LLP

(57) ABSTRACT

In wireless communication devices, internally matching impedance in millimeter wave packaging enables better signal retention at high frequencies in the range of 15 GHz and above. Through the use of differential wire bond signal transmission, the inherent inductance of a millimeter wave package can be matched by the capacitance of the package wire bonds if the capacitance is tailored. The capacitance can be tailored by calculating a suitable distance between wire bonds and tuning the dielectric constant of the over-mold material. A differential set of wire bonds act like a differential transmission line whose characteristic impedance can be tuned by configuring the dielectric constant of the over-mold of the millimeter wave package.

16 Claims, 5 Drawing Sheets

DIFFERENTIAL INTERNALLY MATCHED WIRE-BOND INTERFACE

FIELD OF INVENTION

The present invention relates to high frequency integrated circuit packaging. More particularly, the invention relates to an integrated circuit package having a differential internally matched wire-bond interface.

BACKGROUND OF THE INVENTION

As integrated circuits operate at higher frequencies, the integrated circuit design must account for signal loss caused by impedance mismatch due to packaging. One method of transferring a signal between a die and a substrate is the use of wire bonds. However, wire bonds used in signal transfer are inductive and thereby result in higher impedance mismatch at higher frequencies. Thus, an off-chip matching circuit which is capacitive in nature is generally used.

For example, a single ended wire bond interface may be used to connect a single wire bond or multiple wire bonds between a single die bond pad and a single lead on the package. The single lead on the package connects to a single microstrip line. The single ended wire bond approach results in an inductance created by the overall wire bond length. This approach requires an off-chip matching circuit which is capacitive to match the die impedance, of which wire bond inductance is a component. However, at higher frequencies the inductive reactance due to wire length increases, thereby requiring a higher capacitance in the off-chip match. This leads to higher Quality factor and subsequently lower bandwidth. Consequently, a lower bandwidth makes the circuit less tolerant to manufacturing variations.

Additionally, integrated circuits that operate at high frequencies, for example 15 GHz or above, present certain design considerations. The reactance created at 15 GHz or above is more than the reactance created when operating at lower frequencies. The increase in reactance when operating at high frequencies results in a need to balance with increased capacitive off-chip matching circuitry. At present, the difficulty of impedance matching at high frequencies results in increased signal loss and an increase in return loss.

Another method of transferring a signal between a die and a substrate, that addresses the issue of impedance matching at high frequencies, is the use of flip-chip technology. The flip-chip approach involves, for example, growing a copper pillar on a die, and then connecting the die upside down to the substrate. This method results in a shorter connection, and therefore less inductance. One of the benefits of this method is that lower inductance can be managed in integrated circuit design more easily. However, the flip-chip approach presents challenges of heat dissipation when using higher power, which raises junction temperature on the die. Different measures have been taken to manage this thermal issue but there is a limit to the effectiveness and the practicality of these measures.

Thus, there is a need for internal matching of impedance on an integrated circuit that operates at high frequencies and accommodates thermal dissipation and manufacturing tolerance limitations. The invention addresses this and other needs.

SUMMARY OF THE INVENTION

In wireless communication devices, internally matching impedance in millimeter wave packaging enables better signal retention at high frequencies in the range of 15 GHz and above. Through the use of differential wire bond signal transmission, the inherent inductance of a millimeter wave package can be matched by the capacitance of the package wire bonds if the capacitance is tailored. The capacitance can be tailored by calculating a suitable distance between wire bonds and tuning the dielectric constant of the over-mold material. A differential set of wire bonds act like a differential transmission line whose characteristic impedance can be tuned by configuring the dielectric constant of the over-mold of the millimeter wave package.

BRIEF DESCRIPTION OF THE DRAWING FIGURES

A more complete understanding of the present invention may be derived by referring to the detailed description and claims when considered in connection with the drawing figures, wherein like reference numbers refer to similar elements throughout the drawing figures, and:

DETAILED DESCRIPTION

While exemplary embodiments are described herein in sufficient detail to enable those skilled in the art to practice the invention, it should be understood that other embodiments may be realized and that logical electrical and mechanical changes may be made without departing from the spirit and scope of the invention. Thus, the following detailed description is presented for purposes of illustration only.

Figure 1:
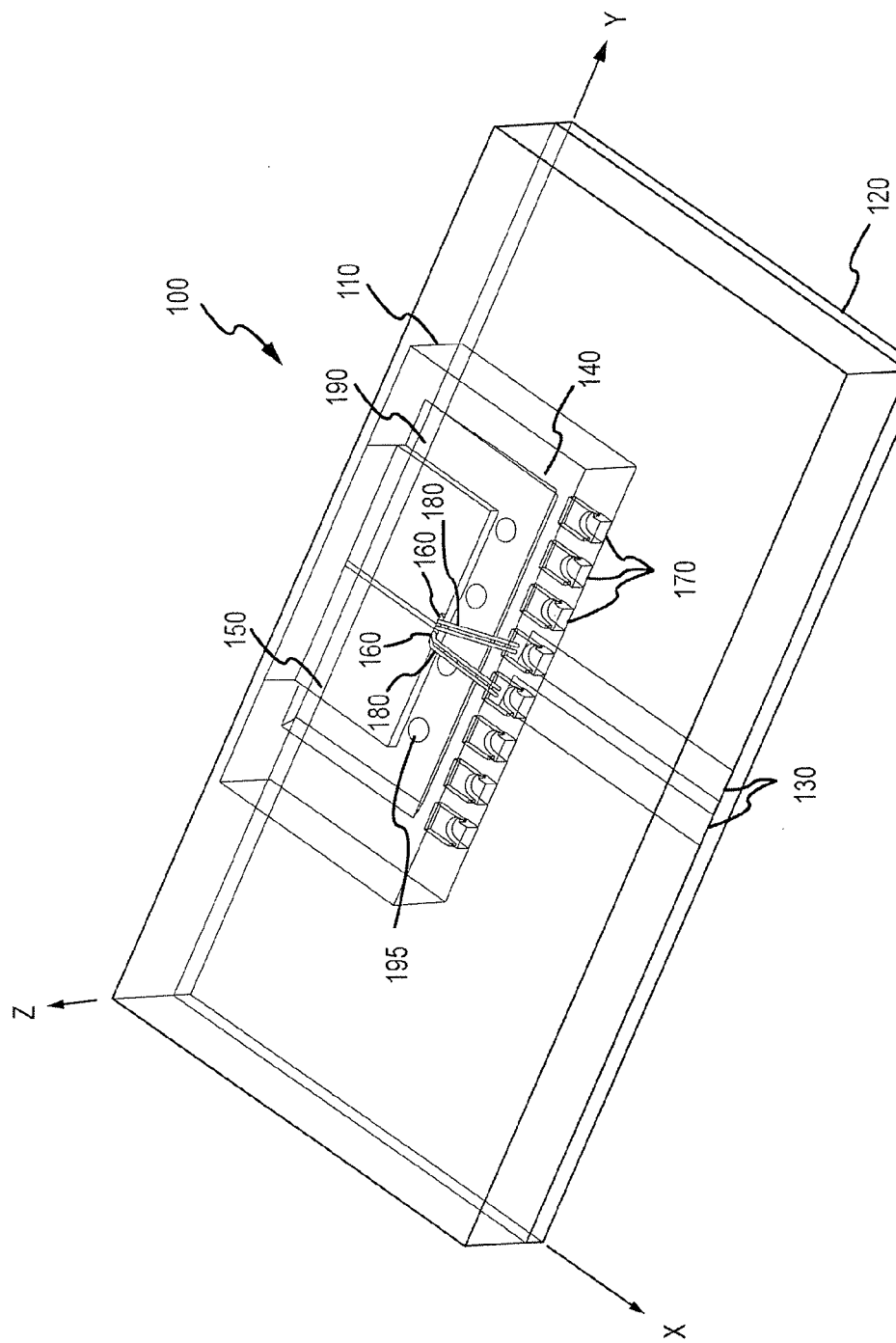
FIG. 1 shows a perspective view of an example of a differential internally matched integrated circuit.

In accordance with an exemplary embodiment of a differential internally matched millimeter wave package (hereinafter referred to as millimeter wave package), and with reference to FIG. 1, millimeter wave package 100 includes a die package 110. In another exemplary embodiment, die package 110 includes an over-mold 140, a die 150, multiple bond pads 160, leads 170, and multiple wire bonds 180.

In an exemplary embodiment, millimeter wave package 100 may further include a substrate 120, and coupled microstrip lines 130 located on substrate 120. Substrate 120 may also be a printed circuit board (PCB). In an exemplary embodiment, substrate 120 is, for example, ceramic or duroid material. Furthermore, substrate 120 may be constructed of any suitable material as would be known in the art. Die package 110 is in communication with or located on substrate 120.

In an exemplary embodiment, die package 110 is a quad flat no-lead (QFN) package. An example of a suitable QFN is the 440474LF QFN package manufactured by UNISEM. In another exemplary embodiment, die package 110 is a small leadless package (SLP). Furthermore, any suitable QFN or SLP package may be configured as described herein. Moreover, die package 110 is any suitable leadless over-mold package that is configured to house a die and facilitate connection to the next higher assembly level.

In an exemplary embodiment, die 150 is a monolithic microwave integrated circuit (MMIC). In an exemplary embodiment, a MMIC comprises gallium arsenide. Moreover, any MMIC with similar characteristics is suitable. In another exemplary embodiment, die 150 is a radio frequency integrated circuit (RFIC). In an exemplary embodiment, a RFIC comprises silicon. Furthermore, die 150 is any suitable RFIC that is configured to communicate RF signals between the die and the substrate, as would be known in the art.

In an exemplary embodiment, multiple bond pads 160 are located on die 150 and are configured to provide a connection interface between die 150 and substrate 120. For example, multiple bond pads 160 may be configured to provide a landing zone for wire bonds 180 on die 150.

In an exemplary embodiment, leads 170 are configured to provide a second connection interface between die 150 and substrate 120. For example, leads 170 may be configured to connect with coupled microstrip lines 130 and provide a connection point on substrate 120 for wire bonds 180 from die 150.

Furthermore, in another exemplary embodiment, millimeter wave package 100 also includes a paddle 190 and a ground connection 195. In accordance with an exemplary embodiment, paddle 190 is, made of copper or any other suitable material as would be known in the art. Additionally, paddle 190 provides a connection point for die 150. In an exemplary embodiment, paddle 190 has high enough thermal conductivity to serve as a heat sink. In an exemplary embodiment, ground connection 195 is a hole in substrate 120 which is configured to provide a connection point from paddle 190 to the ground layer of substrate 120.

Figure 2:
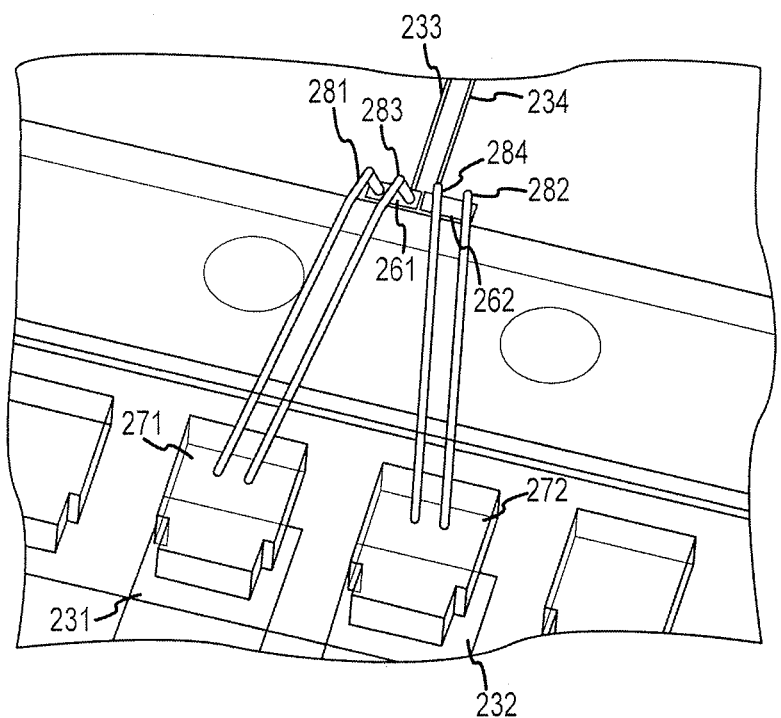
FIG. 2 shows a perspective view of a close-up example of a differential internally matched integrated circuit.

In accordance with an exemplary embodiment and with reference to FIG. 2, a first wire bond 281 connects between a first lead 271 and first bond pad 261, and a second wire bond 282 connects between a second lead 272 and second bond pad 262, with first lead 271 and second lead 272 connecting to coupled microstrip lines 231, 232 respectively. In another exemplary embodiment, first wire bond 281 and a third wire bond 283 connect between first lead 271 and first bond pad 261, and second wire bond 282 and a fourth wire bond 284 connect between second lead 272 and second bond pad 262, with first and second leads 271, 272 connecting to coupled microstrip lines 231, 232 respectively. In accordance with yet another an exemplary embodiment, three or more wire bonds connect between first lead 271 and first bond pad 261, and a second set of three or more wire bonds connect between second lead 272 and second bond pad 262, with first and second leads 271, 272 connecting to coupled microstrip lines 231, 232. In an exemplary embodiment, first bond bad 261 and second bond pad 262 connect wire bonds to coupled microstrip lines 233, 234 respectively, which are located on the die. The die package further configures additional wire bonds to reduce the incremental inductance of the differential wire bond pair. However, configuring the die package to further comprise additional wire bonds may also undesirably involve more space and a larger bond pad.

In an exemplary embodiment, a signal transmits between substrate 120 and die 150 by passing along coupled microstrip lines 130 to multiple leads 170 and through wire bonds 180. When a section of the wire bond is considered, as the length of the wire bond increases, so does the resulting inductance. Using a shorter wire is a simple way to reduce the inductance, but this tends to make manufacturing more difficult.

In accordance with an exemplary embodiment, two sets of wire bonds 180 are used to transmit the signal between substrate 120 and die 150, creating a differential transmission line effect. The two sets of wire bonds are both configured to create capacitance between two wire bonds 180 and aid in creating a transmission line. In an exemplary embodiment, the capacitance is approximately directly proportional to the dielectric constant and approximately inversely proportional to the distance between two wire bonds 180.

The length of the wire bond is a design factor as signal frequency is increased. At high frequencies the length of the wire bond becomes comparable to the wavelength of a signal. In general, a wire bond behaves as a transmission line if the length of the wire bond is greater than $1/10$ of the signal wavelength. For example, a wire bond length of 1000 μm is typically achievable in most QFN manufacturing processes. Assuming a dielectric constant value of 3, this wire bond length approaches $1/10^{th}$ of the signal wavelength at 15 GHz.

Changing the dielectric constant of the over-mold 140 material also affects the electrical length of the wire bond transmission line. In an exemplary embodiment, the wavelength of the signal is inversely proportional to square root of the dielectric constant. In an exemplary embodiment, the wire bond transmission line is configured to appear longer as the dielectric constant is increased. In accordance with the exemplary embodiment, the incremental capacitance is configured to increase directly with the dielectric constant and thus is impacted more than the electrical length. Selection of over-mold 140 material is a function of the frequency of the differential signal. In an exemplary embodiment, the transmission line effect of the wire bonds is configured so that incremental inductance of the wire bonds is matched by incremental capacitance. By substantially or fully matching the incremental inductance and capacitance, the need for off-chip matching circuitry is reduced or eliminated.

In accordance with an exemplary embodiment, at least one of the reference impedance of the substrate and the impedance of the die is configured to provide additional differential internal matching of a wire-bond interface. In an exemplary embodiment, both die 150 and substrate 120 have the same reference impedance. In another exemplary embodiment, die 150 and substrate 120 have different impedances. In an exemplary embodiment, the reference impedances of die 150 and substrate 120 are within the range of 10 ohms to 200 ohms. In another exemplary embodiment, the reference impedances of die 150 and substrate 120 are both approximately 100 ohms. In accordance with other exemplary embodiments, at least one of die 150 and substrate 120 are designed to facilitate matching impedance at the wire bond interface.

In an exemplary embodiment, die package 110 comprises an over-mold 140. In accordance with an exemplary embodiment, over-mold 140 forms a block with little to no cavities present. Over-mold 140 material is also present around wire bonds 180 and between multiple wire bonds 180. Moreover, over-mold 140 is configured to protect the die components, wire bonds, and connections from being disturbed, thus making die package 110 more durable.

The material of over-mold 140 has a dielectric constant characteristic. In accordance with an exemplary embodiment of the present invention, tuning the dielectric constant of the material of over-mold 140 changes the die package 110 capacitance. The dielectric material may be tuned, for example, by using different over-mold materials that possess different material characteristics. In general in the prior art, it is common to try and minimize the dielectric constant of the over-mold material when designing an integrated circuit. However, in accordance with an exemplary embodiment, tuning may involve increasing or decreasing the dielectric constant depending on the design parameters. In an exemplary embodiment, the dielectric constant of over-mold 140 material is in a range of 2-20. In another exemplary embodiment, the dielectric constant of over-mold 140 material is 4. In another exemplary embodiment, the dielectric constant of over-mold 140 material is 5 and above. In another exemplary embodiment, the dielectric constant of over-mold 140 material is 6 and above. In another exemplary embodiment, the dielectric constant of over-mold 140 material is 8 and above. In yet another exemplary embodiment, the over-mold material is model EME-G770HCD made by Sumitomo which has a dielectric constant of 3.71. In another exemplary embodiment, the over-mold material may be, for example, EP-939 with a dielectric constant of 4.2, ME-455-1 with a dielectric constant of 3.37, and ME-456 with a dielectric constant of 3.6. In an exemplary embodiment, the over-mold material includes a liquid crystal polymer, which has a tailorable dielectric constant in the range of 2-20. Tuning the dielectric constant of the material of over-mold 140 to tailor the die package 110 capacitance helps to cancel the incremental inductance in millimeter wave package 100. In an exemplary embodiment, the millimeter wave package is tailored so that no external matching is required. Moreover, the over-mold material may be any suitable material configured to protect die components and tune capacitance between wire bonds 180.

In one exemplary embodiment, the dielectric constant of the over-mold material is consistent throughout die package 110. In another exemplary embodiment, the dielectric constant of the over-mold material may differ throughout die package 110, but the relevant dielectric constant in terms of capacitance is the dielectric constant of the material surrounding two or more wire bonds 180.

In an exemplary embodiment, when a differential signal is transmitted through the coupled microstrip lines, the signals are 180 degrees out of phase between each other. In another exemplary embodiment, the differential signal is nominally 180 degrees or between approximately 170 degrees and 190 degrees, out of phase between each other. For example, creation of the differential signal may be achieved by using a 180 degree hybrid. In an exemplary embodiment, a Balun is used to divide the signal into two signals with 180 degree phase difference between each other. Moreover, any suitable combination of hybrids that results in a nominal 180 degree phase shift as would be known in the art may be used. Once the differential signal is transmitted it can either be recombined on the die using another 180 degree hybrid or the signal can be processed on the die in a differential state, for example, using a differential amplifier.

One advantage of using a differential signal is that it improves isolation between the package points. Noise that couples to the differential transmission line is common mode and thereby gets canceled, resulting in approximately a noiseless signal. In an exemplary embodiment, the package points are transmit and receive points when transmitting a signal on-chip or off-chip. Another advantage of using a differential mode of signal transmission is the effect of a virtual ground. In a single ended wire bond interface, ground discontinuities severely affect signal transmission. However, in an exemplary embodiment, when using a differential mode, the signals are referenced to each other, creating a "virtual" ground. This reduces ground discontinuities present in a single end wire bond configuration.

Figure 3:
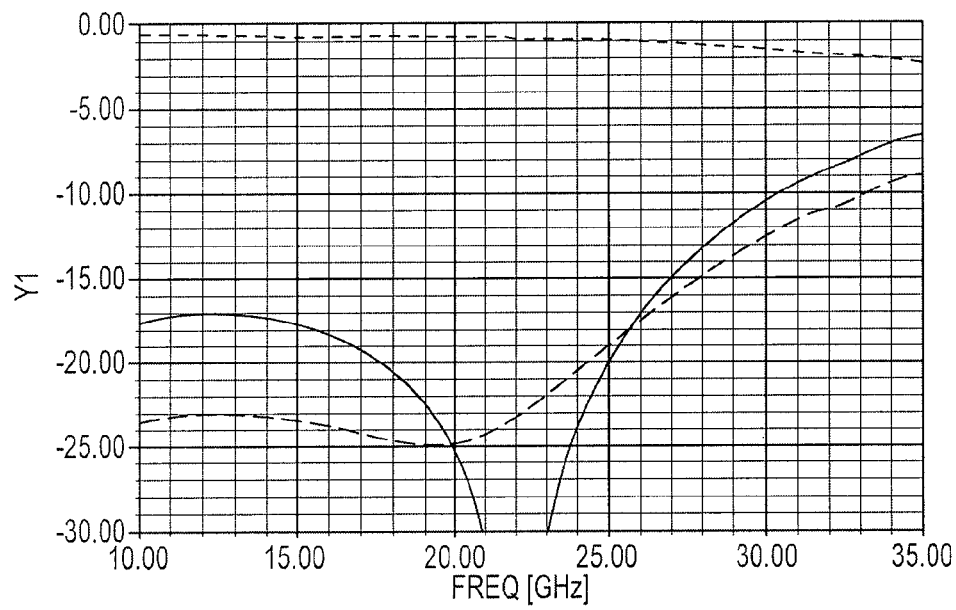
FIG. 3 shows a graph of an example of an integrated circuit designed with a dielectric constant of 4 to achieve acceptable signal transfer at high frequency, the dashed line represents the return loss on the die loss and the solid line represents return loss on the substrate loss.

In an exemplary embodiment, and with reference to FIG. 3, the die package is designed to minimize the return loss when a signal is transmitted between a die and a PCB. Minimization of the return loss less than −15 dB is considered good. The graph of FIG. 2, for example, shows a return loss on the substrate loss of less than −30 dB for a frequency range of 21-23 GHz. This improved return loss was achieved by designing the dielectric constant of the over-mold material so that the differential mode wire bonds create a transmission line effect that cancels the wire bond incremental inductance, resulting in internal matching and avoiding signal loss caused by the use of external matching circuitry.

Figure 4:
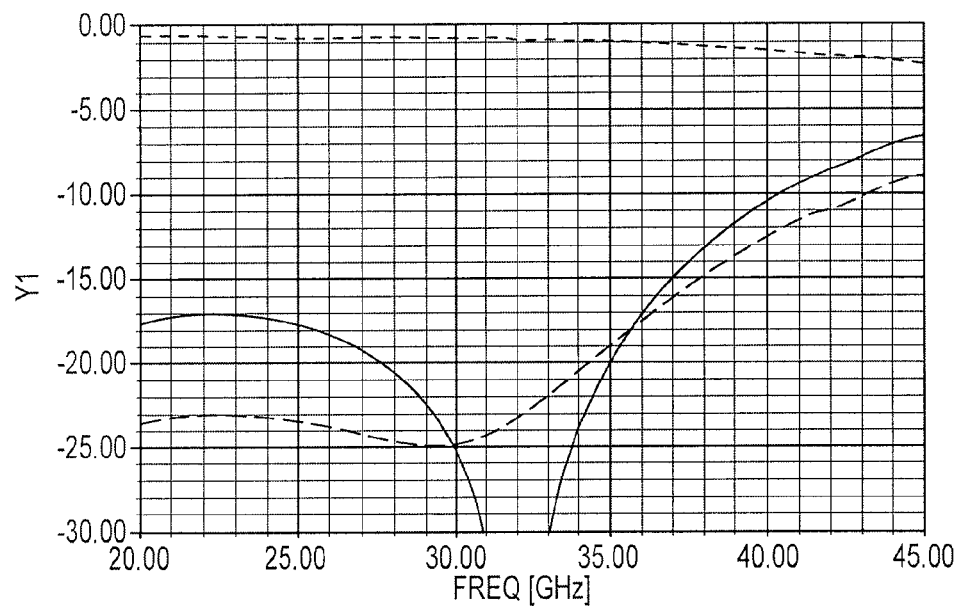
FIG. 4 shows an exemplary graph of an example of an integrated circuit with a designed dielectric constant that achieves acceptable signal transfer up to 37 GHz.

With reference to FIG. 3 and the example of FIG. 4, the frequency range of acceptable return loss is shifted higher up the frequency axis by tuning the dielectric constant of the over-mold, the distance between the differential sets of wire bonds, the length of the wire bonds, and the shape of the wire bonds. In an exemplary embodiment, the increase in internal incremental capacitance is the result of an increase in the dielectric constant of the over-mold material. In another exemplary embodiment, the increase in internal incremental capacitance is the result of a decrease in the distance between wire bonds. In yet another exemplary embodiment, the increase in internal incremental capacitance is the result of configuring more wire bonds in parallel to attach the leads to the die. In another exemplary embodiment, the increase in internal incremental capacitance is the result of configuring the shape of the wire bonds.

In an exemplary embodiment, high frequency is considered 15 GHz and above. In another exemplary embodiment, high frequency is considered 20 GHz or above. In another exemplary embodiment, high frequency is considered to be 30 GHz or above. In yet another exemplary embodiment, high frequency is considered to be 40 GHz and above. In an exemplary embodiment, a high frequency range is considered to be 15 GHz-120 GHz. In another exemplary embodiment, a high frequency range is considered to be 30 GHz-100 GHz. In yet another exemplary embodiment, a high frequency range is considered to be 50 GHz-80 GHz. This exemplary embodiment of a high frequency range is selected to include the frequencies at which automobile radars operate.

Figure 5:
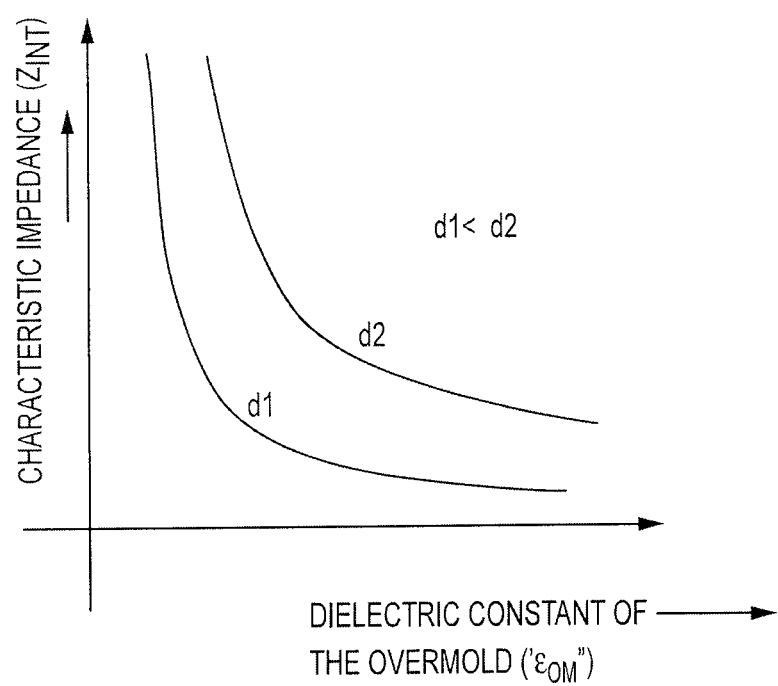
FIG. 5 shows an exemplary graph demonstrating the relationship between a dielectric constant, the characteristic impedance of an interface and the affect of different spacing between conductors.

In an exemplary embodiment, the characteristic impedance of the wire bond interface (ZINT) is the same as the input impedance of the die ($Z_{DIE}$) and the reference impedance on the PCB ($Z_{PCB}$) at the frequency of interest. Furthermore, a method of configuring the dielectric constant may be described by the relationship:

$$\varepsilon_{OM} \propto \frac{\Delta l_{wire} * d}{Z_{INT}^2}$$

Where "$\Delta l_{wire}$" is the incremental inductance per unit length, "d" is the distance between the differential pair and '$\varepsilon_{OM}$' is the dielectric constant of the over-mold material. With reference to FIG. 5, this equation describes that for lower characteristic impedances, higher dielectric constant materials are needed. Additionally, in an exemplary embodiment, increasing the distance between two wire bonds while maintaining a particular dielectric constant increases the impedance of the wire bond interface.

In an exemplary embodiment, a wire bond interface method includes selecting a wire bond, selecting an over-mold dielectric constant, analyzing the characteristic impedance of the differential wire bond interface, and tailoring the impedance accordingly.

The first step of selecting a wire bond involves choosing a wire bond diameter and the number of wire bonds to implement. In a typical wire bond configuration, 1 mil gold wire is used which has an incremental inductance per unit length ($\Delta l_{wire}$) of 0.015 nH/mil. Additionally, in an exemplary embodiment, the number of wires per path is increased to two when operating at frequencies of 20 GHz or more, as this reduces the incremental inductance per unit length by a factor of two.

The next step is to select an over-mold dielectric constant. Once the over-mold material is selected, the third step is to do an analysis of the characteristic impedance of the differential wire bond interface. In an exemplary embodiment, 3-dimensional electromagnetic analysis software is used. In an exemplary embodiment, the analysis software is HFSS. In another exemplary embodiment, the analysis software is CST Studio. The wire bond interface as selected in the prior steps is simulated and coupled differential microstrip lines of desired impedance are included.

The fourth step in the exemplary method is to tailor the impedance in light of the wire bond interface analysis. If the characteristic impedance of the differential wire bond interface should increase, the dielectric constant of the over-mold material can be decreased or the distance between the wire bonds can increase. If the characteristic impedance should decrease, the dielectric constant can increase or the distance between the wire bonds can decrease. Additionally, increasing the number of wire bonds will result in a decrease of the characteristic impedance. After the wire bond interface has been tailored in an attempt to achieve the desired characteristic impedance, repeat the analysis step and tailor the interface accordingly. Repeat these steps until achieving the desired characteristic impedance.

Once the estimated parameters are selected from the exemplary method above, draw a final package interface with the QFN leads and differential microstrip lines. The final package configuration may require adjustments to optimize for best performance.

In an exemplary embodiment, a high frequency interconnect includes a differential pair of conductors with a first end and a second end, encapsulated in a material with a dielectric constant. A signal is transmitted across differential pair of conductors and a controlled characteristic impedance is maintained across the high frequency interconnect. The characteristic impedance is controlled in part by the conductor configuration, including the space between the differential pair of conductors and the dielectric constant of the encapsulating material of the interconnect. In an exemplary embodiment, differential pair of conductors is at least one of a wire bond and a ribbon bond. Moreover, differential pair of conductors can be any other suitable conductor as would be known in the art.

Figure 6:
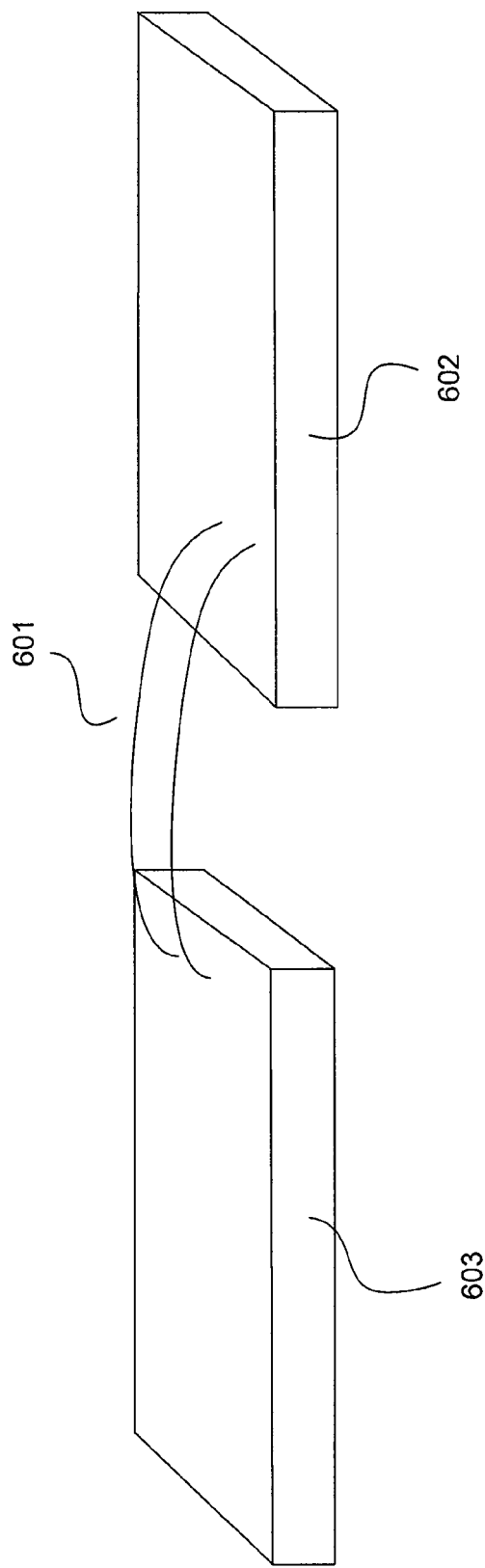
FIG. 6 shows a perspective view of an exemplary connection of differential conductors between two components.

In accordance with an exemplary embodiment and with reference to FIG. 6, the first end of the conductors 601 attaches to a first component 602, such as a die and the second end of the conductors attaches to a second component 603, such as another die. In the exemplary embodiment, the differential pair of conductors is encapsulated by a dielectric constant material. First component 602 and second component 603 may be either a die or a printed circuit board. In another exemplary embodiment, the differential pair of conductors and the two interconnected die are all encapsulated with a dielectric constant material. In another exemplary embodiment, the first end of the conductors attaches to a die 602 and the second end of the conductors attaches to a printed circuit board 603. In yet another exemplary embodiment, the first end of the conductors attaches to a printed circuit board 602 and the second end of the conductors attaches to attached to another printed circuit board 603.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as critical, required, or essential features or elements of any or all the claims. As used herein, the terms "includes," "including," "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. Further, no element described herein is required for the practice of the invention unless expressly described as "essential" or "critical."

What is claimed is:

1. A high frequency interconnect comprising:
a pair of differential conductors each with a first end and a second end, wherein said first end of said pair of differential conductors attaches to a first die and said second end attaches to a second die;
a material with a dielectric constant encapsulating said pair of differential conductors;
a conductor configuration comprising a distance between said pair of differential conductors and further comprising said dielectric constant of said material; and
wherein a differential signal is transmitted across said pair of differential conductors and wherein a characteristic impedance, controlled by said conductor configuration, is maintained across said high frequency interconnect, and wherein said characteristic impedance is maintained by balancing an incremental internal inductance of said high frequency interconnect with an incremental internal capacitance of said high frequency interconnect.

2. The high frequency interconnect of claim 1, wherein said pair of differential conductors are wire bonds.

3. The high frequency interconnect of claim 1, wherein said pair of differential conductors are ribbon bonds.

4. A differential internally matched wire-bond interface comprising:
a die package comprising:
a die;
a first wire bond attached to said die;
a second wire bond attached to said die;
an over-mold material having a dielectric constant;
wherein said first wire bond and said second wire bond are embedded in said over-mold material;
wherein a differential radio frequency signal is transmitted through said first wire bond and said second wire bond;
wherein said differential radio frequency signal generates a transmission line effect in said first wire bond and said second wire bond; and
wherein said dielectric constant is configured to generate an incremental capacitance configured to maintain a desired characteristic impedance.

5. The internally matched wire-bond interface device of claim 4, wherein said dielectric constant of said over-mold material is 7 and above.

6. The internally matched wire-bond interface device of claim 4, wherein said dielectric constant of said over-mold material is in the range of 5-10.

7. The high frequency interconnect of claim 1, wherein said dielectric constant of said over-mold material is 5 and above.

8. The internally matched wire-bond interface device of claim 4, wherein said dielectric constant of said over-mold material is 5 and above.

9. A high frequency interconnect comprising:
a pair of differential conductors each with a first end and a second end, wherein said first end of said pair of differential conductors attaches to a first printed circuit board and said second end attaches to a second printed circuit board;
a material with a dielectric constant encapsulating said pair of differential conductors;
a conductor configuration comprising a distance between said pair of differential conductors and further comprising said dielectric constant of said material; and
wherein a differential signal is transmitted across said pair of differential conductors and wherein a characteristic impedance, controlled by said conductor configuration, is maintained across said high frequency interconnect, and wherein said characteristic impedance is maintained by balancing an incremental internal inductance of said high frequency interconnect with an incremental internal capacitance of said high frequency interconnect.

10. The high frequency interconnect of claim 9, wherein said pair of differential conductors are wire bonds.

11. The high frequency interconnect of claim 9, wherein said pair of differential conductors are ribbon bonds.

12. The high frequency interconnect of claim 9, wherein said dielectric constant of said over-mold material is 5 and above.

13. A high frequency interconnect comprising:
a pair of differential conductors each with a first end and a second end, wherein said first end of said pair of differential conductors attaches to a die and said second end attaches to a printed circuit board;
a material with a dielectric constant encapsulating said pair of differential conductors;
a conductor configuration comprising a distance between said pair of differential conductors and further comprising said dielectric constant of said material; and
wherein a differential signal is transmitted across said pair of differential conductors and wherein a characteristic impedance, controlled by said conductor configuration, is maintained across said high frequency interconnect, and wherein said characteristic impedance is maintained by balancing an incremental internal inductance of said high frequency interconnect with an incremental internal capacitance of said high frequency interconnect.

14. The high frequency interconnect of claim 13, wherein said pair of differential conductors are wire bonds.

15. The high frequency interconnect of claim 13, wherein said pair of differential conductors are ribbon bonds.

16. The high frequency interconnect of claim 13, wherein said dielectric constant of said over-mold material is 5 and above.

* * * * *